United States Patent
Lee (10) Patent No.: US 9,099,302 B2
(45) Date of Patent: Aug. 4, 2015

(54) SEMICONDUCTOR DEVICES INCLUDING SPACERS ON SIDEWALLS OF CONDUCTIVE LINES AND METHODS OF MANUFACTURING THE SAME

(71) Applicant: SK hynix Inc., Icheon-si (KR)

(72) Inventor: Jong Pil Lee, Hwaseong-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/514,207

(22) Filed: Oct. 14, 2014

(65) Prior Publication Data
US 2015/0044868 A1    Feb. 12, 2015

Related U.S. Application Data

(62) Division of application No. 13/719,044, filed on Dec. 18, 2012, now Pat. No. 8,860,110.

(30) Foreign Application Priority Data

Jul. 30, 2012    (KR) .................. 10-2012-0083537

(51) Int. Cl.
| | |
|---|---|
| *H01L 21/02* | (2006.01) |
| *H01L 23/538* | (2006.01) |
| *H01L 21/48* | (2006.01) |
| *H01L 27/108* | (2006.01) |
| *H01L 21/768* | (2006.01) |

(52) U.S. Cl.
CPC ........ *H01L 21/022* (2013.01); *H01L 21/02107* (2013.01); *H01L 21/48* (2013.01);
(Continued)

(58) Field of Classification Search
CPC ............ H01L 27/108; H01L 27/10805; H01L 27/10808; H01L 27/10814; H01L 27/10882; H01L 27/10885; H01L 27/10888; H01L 21/02107; H01L 21/02109; H01L 21/02112; H01L 21/022
See application file for complete search history.

(56) References Cited

U.S. PATENT DOCUMENTS

| 6,881,659 B2 | 4/2005 | Park et al. |
|---|---|---|
| 7,361,550 B2 | 4/2008 | Kim |

(Continued)

FOREIGN PATENT DOCUMENTS

| KR | 1020030006893 A | 1/2002 |
|---|---|---|
| KR | 100630746 B1 | 9/2006 |

(Continued)

OTHER PUBLICATIONS

U.S. Appl. No. 13/719,044, Restriction Requirement, mailed Mar. 14, 2014.

(Continued)

*Primary Examiner* — Eduardo A Rodela
(74) *Attorney, Agent, or Firm* — Kilpatrick Townsend & Stockton LLP (57) ABSTRACT

Semiconductor devices are provided that include spacers on sidewalls of conductive lines, as well as methods for manufacturing the same. A method for manufacturing a semiconductor device includes forming bit lines on a semiconductor substrate. Triple-layered bit line spacers are formed on respective sidewalls of the bit lines. An interlayer insulation layer is formed on the bit lines and the triple-layered bit line spacers. Storage node contact plugs that penetrate the interlayer insulation layer are formed between the bit lines. Portions of the triple-layered bit line spacers are etched to form recessed regions. An insulation layer is formed on the substrate including the recessed regions. Storage node electrodes electrically connected to the storage node contact plugs are formed.

15 Claims, 5 Drawing Sheets

(52) U.S. Cl.
CPC ........... *H01L 21/486* (2013.01); *H01L 21/768* (2013.01); *H01L 21/76802* (2013.01); *H01L 21/76819* (2013.01); *H01L 21/76835* (2013.01); *H01L 21/76837* (2013.01); *H01L 21/76877* (2013.01); *H01L 23/538* (2013.01); *H01L 23/5384* (2013.01); *H01L 27/108* (2013.01); *H01L 27/10814* (2013.01); *H01L 27/10855* (2013.01); *H01L 27/10885* (2013.01); *H01L 21/76832* (2013.01); *H01L 21/76834* (2013.01); *H01L 2924/0002* (2013.01)

(56) References Cited

U.S. PATENT DOCUMENTS

| | | | |
|---|---|---|---|
| 7,709,367 | B2 | 5/2010 | Lee et al. |
| 7,977,724 | B2 | 7/2011 | Park |
| 8,860,110 | B2 | 10/2014 | Lee |
| 2007/0123040 | A1 | 5/2007 | Hwang et al. |
| 2009/0026515 | A1 | 1/2009 | Shin et al. |
| 2012/0112339 | A1* | 5/2012 | Park .............................. 257/734 |
| 2012/0187535 | A1 | 7/2012 | Lee |
| 2013/0049091 | A1* | 2/2013 | Saino ............................ 257/310 |

FOREIGN PATENT DOCUMENTS

| | | |
|---|---|---|
| KR | 1020070098319 A | 10/2007 |
| KR | 1020120012593 A | 2/2012 |

OTHER PUBLICATIONS

U.S. Appl. No. 13/719,044, Notice of Allowance, mailed Jun. 9, 2014.

* cited by examiner

FIG.1

Related Art

SEMICONDUCTOR DEVICES INCLUDING SPACERS ON SIDEWALLS OF CONDUCTIVE LINES AND METHODS OF MANUFACTURING THE SAME

CROSS-REFERENCES TO RELATED APPLICATIONS

The present application is a divisional of U.S. patent application Ser. No. 13/719,044, filed Dec. 18, 2012, which claims priority under 35 U.S.C 119(a) to Korean Application No. 10-2012-0083537, filed on Jul. 30, 2012, in the Korean Intellectual Property Office, both of which are incorporated herein by reference in their entirety.

BACKGROUND

Embodiments of the present disclosure relate to semiconductor devices and methods of manufacturing the same and, more particularly, to semiconductor devices including spacers on sidewalls of conductive lines and methods of manufacturing the same.

Dynamic random access memory (DRAM) semiconductor devices may include a plurality of memory cells, and each of the memory cells may include a single cell transistor and a single cell capacitor. The cell capacitor may be electrically connected to a storage node contact plug formed between bit lines, and the storage node contact plug may be electrically connected to a semiconductor substrate. When the alignment between the storage node contact plugs and the bit lines is out of an allowed range during a photolithography process for forming the storage node contact plugs, the storage node contact plugs may contact the bit lines.

The semiconductor devices, for example the DRAM devices, may include sense amplifiers electrically connected to the bit lines. As the semiconductor devices have become more highly integrated, a ratio of a capacitance Cs of the cell capacitor to a parasitic capacitance Cb of the bit line has been reduced. Thus, a sensing margin of the sense amplifiers is reduced and may cause malfunction of the semiconductor devices. Accordingly, minimization of the parasitic capacitance between the bit lines and the storage node contact plugs is increasingly desired with the development of highly-integrated, smaller and faster semiconductor memory devices. In particular, as the semiconductor devices are scaled down to a minimum feature size of about several nanometers, the parasitic capacitance between the bit lines and the storage node contact plugs becomes an important parameter affecting operation and/or performance of the semiconductor devices.

In an attempt to reduce the bit line capacitance Cb, techniques for forming a low-k dielectric layer on sidewalls of the bit lines have been proposed. For example, a nitride/oxide/nitride (NON) spacer layer may be formed by depositing a nitride layer on a substrate including conductive lines, oxidizing the nitride layer to form an oxide layer having a lower dielectric constant than the nitride layer at a surface of the nitride layer, and depositing another nitride layer on the oxide layer.

Figure 1:
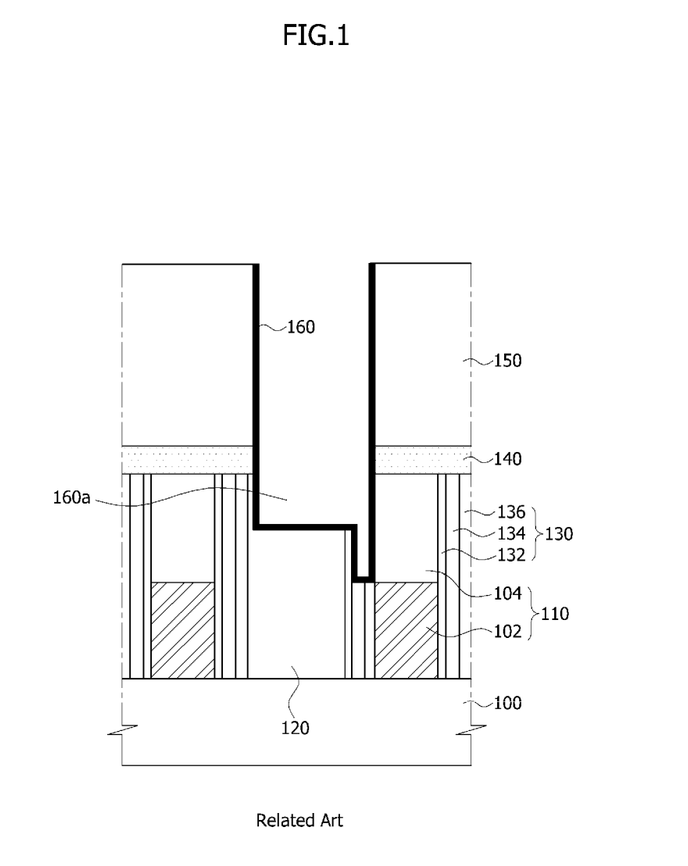
FIG. 1 is a cross sectional view illustrating an exemplary DRAM device including NON structural bit line spacers.

FIG. 1 is a cross sectional view illustrating an exemplary DRAM device including bit line spacers having an NON structure. In FIG. 1, some elements such as landing contact plugs are not shown for the purpose of ease and convenience in explanation.

Referring to FIG. 1, bit line stacks 110 are disposed on a semiconductor substrate 100. Each of the bit line stacks 110 includes a conductive pattern 102 and a hard mask pattern 104 which are sequentially stacked. A storage node contact plug 120 may be disposed between the bit line stacks 110. NON structural spacers 130 (also referred to as NON spacers) are disposed on respective ones of sidewalls of the bit line stacks 110. The NON spacers 130 are disposed to electrically insulate the storage node contact plug 120 from the bit line stacks 110. Each of the NON spacers 130 includes an inner nitride layer (132) contacting the bit line stack 110, an oxide layer (134) on the inner nitride layer (132) opposite to the bit line stack 110, and an outer nitride layer (136) on the oxide layer (134) opposite to the oxide layer (134).

As illustrated in FIG. 1, if an alignment between a storage node electrode hole 160a and the storage node contact plug 120 (or the bit line stacks 110) is outside of an allowed range during a photolithography process for forming the storage node electrode hole 160a that penetrates a sacrificial layer 150 and an etch stop layer 140 to expose the storage node contact plug 120, at least a portion of the NON spacer 130 may be exposed. Further, when the exposed portion of the NON spacer 130 is over-etched, the oxide layer 134 of the exposed NON spacer 130 may be etched faster than the nitride layers 132 and 136 of the exposed NON spacer 130 because an etch rate of the oxide layer 134 is greater than that of the nitride layers 132 and 136. Accordingly, the probability of the electrical shortage between the storage node contact plug 120 and the conductive pattern 102 of the bit line stack 110 may be increased due to a storage node electrode 160 formed in the storage node electrode hole 160a.

SUMMARY

Example embodiments are directed to semiconductor devices including spacers on sidewalls of conductive lines and methods of manufacturing the same.

According to some embodiments, a semiconductor device includes bit lines on a semiconductor substrate, storage node contact plugs penetrating an insulation layer between the bit lines, triple-layered bit line spacers between the bit lines and the storage node contact plugs, and storage node electrodes on the storage node contact plugs. Each of the triple-layered bit line spacers includes a first spacer adjacent to one of the bit lines, a third spacer adjacent to the storage node contact plugs, and a second spacer between the first and third spacers. The second spacer includes a lower portion having a lower dielectric constant than the first and third spacers and an upper portion having the same material as the first and third spacers.

In some embodiments, the first and third spacers may include a nitride layer.

In some embodiments, the lower portions of the second spacers may include an oxide layer.

In some embodiments, each of the bit lines may include a conductive pattern and a hard mask pattern on the conductive pattern.

In some embodiments, the lower portions of the second spacers may have a height which is greater than a height of the conductive patterns of the bit lines.

According to further embodiments, a method of manufacturing a semiconductor device includes forming bit lines on a semiconductor substrate, forming triple-layered bit line spacers on respective ones of sidewalls of the bit lines, forming an interlayer insulation layer on the bit lines and the triple-layered bit line spacers, forming storage node contact plugs that penetrate the interlayer insulation layer between the bit lines, etching portions of the triple-layered bit line spacers to form recessed regions, forming an insulation layer on the substrate including the recessed regions, and forming storage node electrodes electrically connected to the storage node contact plugs.

In some embodiments, each of the bit lines may be formed to include a conductive pattern and a hard mask pattern which are sequentially stacked.

In some embodiments, each of the triple-layered bit line spacers may be formed to include a first spacer adjacent to one of the bit lines, a third spacer adjacent to the storage node contact plugs, and a second spacer between the first and third spacers. The second spacer may be formed to include a lower portion and an upper portion having a different material from the lower portion.

In some embodiments, the first and third spacers may be formed of a nitride layer, and the lower portions of the second spacers may be formed of a material having a lower dielectric constant than the first and third spacers.

In some embodiments, the lower portions of the second spacers may be formed of an oxide layer.

In some embodiments, the second spacers may be oxide layers which are formed using a radical oxidation process, a wet oxidation process or a dry oxidation process.

In some embodiments, forming the storage node contact plugs may include etching the interlayer insulation layer to form a storage node contact holes exposing the semiconductor substrate between the bit lines, forming a conductive layer on the interlayer insulation layer and in the storage node contact holes, and etching back or planarizing the conductive layer.

In some embodiments, etching back or planarizing the conductive layer may be performed using a chemical mechanical polishing (CMP) process.

In some embodiments, etching portions of the triple-layered bit line spacers may be performed by a wet etching process that uses an oxide etchant as an etchant.

In some embodiments, etching portions of the triple-layered bit line spacers may be performed using a buffered oxide etchant (BOE), which is formed by mixing ammonium fluoride ($NH_4F$) solution and hydrofluoric (HF) acid in a volume ratio of 50:1 to 300:1, for 100 seconds to 500 seconds.

In some embodiments, etching portions of the triple-layered bit line spacers may be performed using a buffered oxide etchant (BOE), which is formed by mixing ammonium fluoride ($NH_4F$) solution and hydrofluoric (HF) acid in a volume ratio of 50:1 to 100:1, for 100 seconds to 300 seconds.

In some embodiments, each of the bit lines may be formed to include a conductive pattern and a hard mask pattern which are sequentially stacked, and etching portions of the triple-layered bit line spacers may be performed such that a height of the etched spacers is greater than a height of the conductive patterns constituting the bit lines.

In some embodiments, the insulation layer may be formed of a nitride layer, and the recessed regions may be filled with the insulation layer.

In some embodiments, the insulation layer may be used as an etch stop layer.

In some embodiments, forming the storage node electrode may include forming a sacrificial layer on the insulation layer, patterning the sacrificial layer and the insulation layer to form storage node electrode holes exposing the storage node contact plugs, forming a conductive layer on the substrate including the storage node electrode holes, and etching or planarizing the conductive layer to leave a portion of the conductive layer in the storage node electrode hole.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art. In the drawings, the thicknesses of layers and regions are exaggerated for clarity. Like reference designators in the drawings denote like or corresponding elements, and thus their description will be omitted to avoid duplicate explanation.

Figure 2:
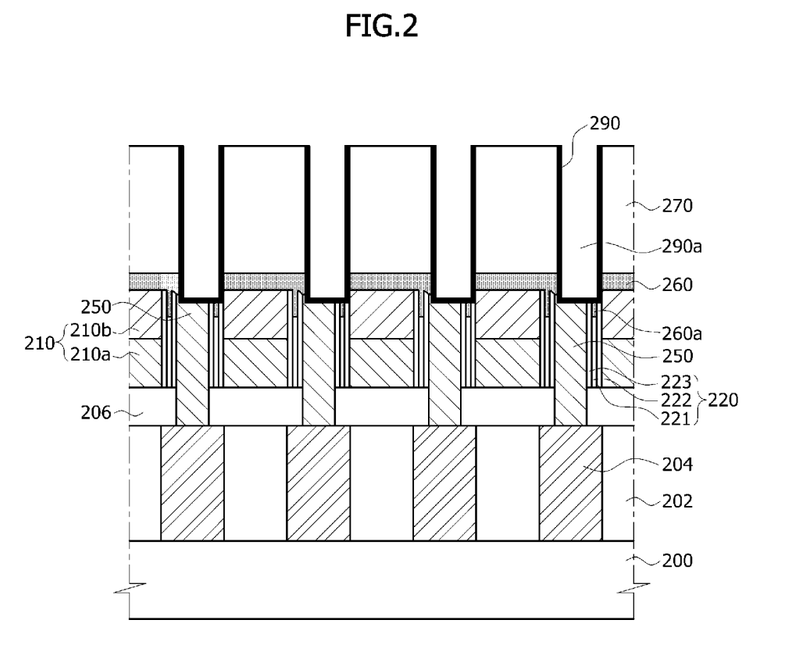
FIG. 2 is a cross sectional view illustrating a semiconductor device according to an example embodiment.

FIG. 2 is a cross sectional view illustrating a semiconductor device according to an example embodiment.

Referring to FIG. 2, a first interlayer insulation layer 202 may be disposed on a semiconductor substrate 200, and a plurality of landing contact plugs 204 may be two dimensionally arrayed in the first interlayer insulation layer 202. Each of the landing contact plugs 204 may penetrate the first interlayer insulation layer 202 to contact the semiconductor substrate 200. A second interlayer insulation layer 206 may be disposed on the first interlayer insulation layer 202 and the landing contact plugs 204. A plurality of bit line 210 may be disposed on the second interlayer insulation layer 206, and storage node contact plugs 250 may be disposed between the bit lines 210. Bit line spacers 220 formed of insulation materials may be disposed between the bit lines 210 and the storage node contact plugs 250. The bit line spacers 220 may electrically insulate the storage node contact plugs 250 from the bit lines 210. Each of the bit lines 210 may include a bit line conductive pattern 210a and a hard mask pattern 210b which are sequentially stacked. The bit line conductive pattern 210a and the hard mask pattern 210b are shown in the bit line stacks of FIGS. 2-7, as they are similar to the conductive pattern 102 and the hard mask pattern 104 shown in FIG. 1.

Each of the bit line spacers 220 may have a triple-layered structure. That is, each of the bit line spacers 220 may include a first spacer 221 adjacent to the bit line 210, a third spacer 223 adjacent to the storage node contact plug 250, and a second spacer 222 between the first and third spacers 221 and 223. The second spacer 222 may include a lower portion having a lower dielectric constant than the first and third spacers 221 and 223 and an upper portion 260a having the same material as the first and third spacers 221 and 223. The first and third spacers 221 and 223 may be the same material and may exhibit a relatively lower etch rate than the second spacer 222 in an oxide etchant. In some embodiments, when the first and third spacers 221 and 223 include a nitride layer, the lower portion of the second spacer 222 may include an oxide layer. Specifically, the lower portion of the second spacer 222 may be a silicon oxide type material, for example, any one selected from the group consisting of an ozone borophosphosilicate glass ($O_3$-BPSG), a high density plasma (HDP) oxide, a thermal oxide, an ozone undoped silicate glass ($O_3$-USG), a phosphosilicate glass (PSG), a silicon rich oxide, a plasma enhanced tetraethylothorsilicate (PE-TEOS), and a plasma enhanced undoped silicate glass (PE-USG). As described above, when each of the bit line spacers 220 has a triple-layered structure such as a nitride-oxide-nitride (NON) layer, a parasitic capacitance between the bit line 210 and the storage node contact plugs 250 may be reduced because of the presence of the oxide layers 222 in the bit line spacers 220.

The bit line 210, the storage node contact plugs 250 and the bit line spacers 220 may be covered with an etch stop layer 260, and a sacrificial layer 270 may be disposed on the etch stop layer 260 opposite to the bit line 210. Storage node electrodes 290 may penetrate the sacrificial layer 270 and the etch stop layer 260 to contact respective ones of the storage node contact plugs 250. In some embodiments, each of the storage node electrodes 290 may have a cylindrical shape, and the sacrificial layer 270 may include an oxide layer. The sacrificial oxide layer 270 may be used as a mask layer for forming the cylindrical storage node electrodes 290, and the etch stop layer 260 may have an etch selectivity with respect to the sacrificial oxide layer 270. Thus, the etch stop layer 260 may protect the underlying layers from being damaged when the sacrificial oxide layer 270 is etched to form storage node electrode holes 290a in which the storage node electrodes 290 are disposed. The etch stop layer 260 may include the same material as the upper portions 260a of the second spacers 222, but is not limited thereto. For example, the etch stop layer 260 may be a different material from the upper portions 260a of the second spacers 222. In some embodiments, the etch stop layer 260 may include a nitride layer.

According to some embodiments, the upper portions 260a of the second spacers 222 may include a nitride layer. Thus, even though the storage node electrode holes 290a are misaligned with the storage node contact plugs 250, the bit line conductive patterns of the bit line 210 may not be exposed due to the presence of the upper portions 260a of the second spacers 222 during formation of the storage node electrode holes 290a.

Further, the upper portions 260a (formed of a relatively high-k dielectric layer) of the second spacers 222 may be disposed only on upper sidewalls of the bit line 210, and the lower portions (formed of a relatively low-k dielectric layer) of the second spacers 222 may be disposed on sidewalls of the conductive patterns of the bit line 210. Thus, the upper portions 260a (formed of a relatively high-k dielectric layer) of the second spacers 222 may not affect a coupling capacitance (e.g., a parasitic capacitance) between the bit line stacks 210 and the storage node contact plugs 250.

Now, methods of manufacturing a semiconductor device including triple-layered bit line spacers will be described hereinafter.

FIGS. 3 to 7 are cross sectional views illustrating a method of manufacturing a semiconductor device according to an example embodiment.

Figure 3:
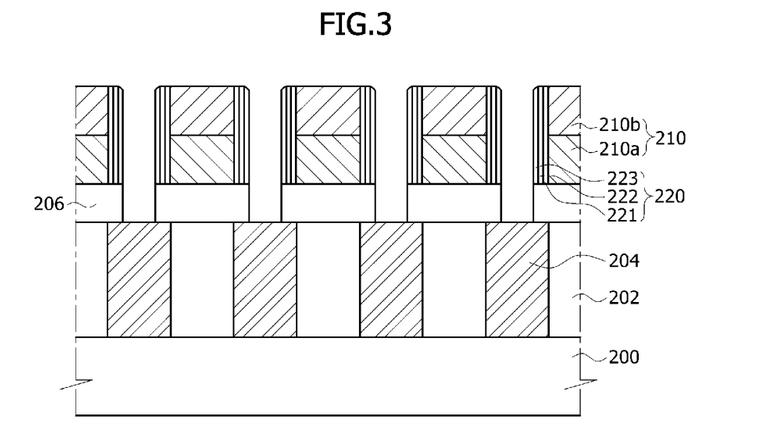
FIGS. 3 to 7 are cross sectional views illustrating a method of manufacturing a semiconductor device according to an example embodiment.

Referring to FIG. 3, a first interlayer insulation layer 202 may be formed on a semiconductor substrate 200 that includes various elements such as transistors, isolation layers and/or interconnection lines (or word lines). Landing contact plugs 204 may then be formed in the first interlayer insulation layer 202. The landing contact plugs 204 may be formed to penetrate the first interlayer insulation layer 202 and to contact portions (e.g., source/drain regions of the transistors) of the semiconductor substrate 200.

A second interlayer insulation layer 206 may be formed on the first interlayer insulation layer 202 and the landing contact plugs 204, and a plurality of bit line 210 may be formed on a top surface of the second interlayer insulation layer 206 opposite to the first interlayer insulation layer 202. In some embodiments, each of the bit line 210 may be formed to include a barrier metal pattern, a metal pattern and a hard mask pattern. The metal pattern may be formed of a tungsten layer, and the hard mask pattern may be formed of a nitride layer.

A bit line spacer layer such as an insulation layer may be deposited on an entire surface of the substrate including the bit line 210, and the bit line spacer layer may be etched back to form bit line spacers 220 on sidewalls of the bit line 210. Each of the bit line spacers 220 may be formed to have a triple-layered structure that includes nitride layers and an insulation layer having a lower dielectric constant than the nitride layers. This is for reducing the parasitic capacitance of the bit line 210. In particular embodiments, each of the bit line spacers 220 may be formed to include an inner nitride layer 221 contacting the bit line 210, an insulation layer 222 on the inner nitride layer 221 opposite to the bit line 210, and an outer nitride layer 223 on the insulation layer 222 opposite to the inner nitride layer 221. The insulation layer 222 may be formed of a material having a lower dielectric constant than the nitride layers 221 and 223. Specifically, the insulation layer 222 may be formed of a silicon oxide type material, for example, any one selected from the group consisting of an ozone borophosphosilicate glass ($O_3$-BPSG), a high density plasma (HDP) oxide, a thermal oxide, an ozone undoped silicate glass ($O_3$-USG), a phosphosilicate glass (PSG), a silicon rich oxide, a plasma enhanced tetraethylothorsilicate (PE-TEOS), and a plasma enhanced undoped silicate glass (PE-USG). In some embodiment, the bit line spacers 220 may be formed by depositing a nitride layer 221 to a thickness of between about 100 angstroms (Å) to about 250 angstroms (Å) on the substrate including the bit line 210, by partially oxidizing the nitride layer 221 using a radical oxidation process, a wet oxidation process or a dry oxidation process to form an oxide layer 222, by depositing another nitride layer 223 to a thickness of between about 100 angstroms (Å) to about 250 angstroms (Å) on the oxide layer 222, and by etching back the nitride layer 223, the oxide layer 222 and the nitride layer 221. As a result, each of the bit line spacers 220 may be formed to have an NON structure.

As described above, in the event that each of the bit line spacers 220 are formed to have an NON structure, a parasitic capacitance of the bit line 210 may be reduced because of a relatively low dielectric constant of the oxide layers 222 in the bit line spacers 220.

Figure 4:
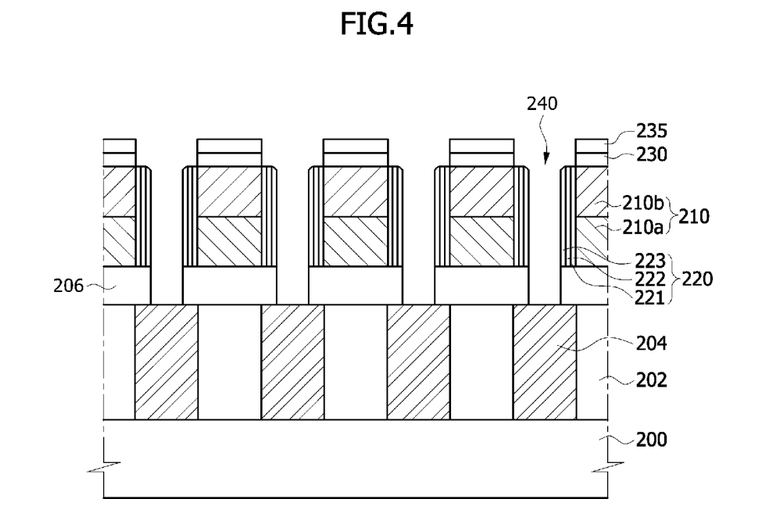

Referring to FIG. 4, a third interlayer insulation layer 230 may be formed on the bit line 210 and the bit line spacers 220 to fill spaces between the bit line spacers 220. The third interlayer insulation layer 230 may be formed of, for example, a borophosphosilicate glass (BPSG) layer, and may be additionally planarized using a chemical mechanical polishing (CMP) process to form a flat surface thereof.

A hard mask layer may be formed on a top surface of the third interlayer insulation layer 230 opposite to the bit line stacks 210. The hard mask layer may be formed to overcome limitations of an etching process which is performed using only a photoresist pattern as an etch mask. The hard mask layer may be formed of a polysilicon layer. A photoresist layer may then be coated on the hard mask layer (not shown). The photoresist layer may be patterned using an exposure process and a develop process, thereby forming a photoresist pattern (not shown) that defines regions where storage node contact plugs are formed. Subsequently, the hard mask layer may be etched using the photoresist pattern as an etch mask to form a hard mask 235. Using the photoresist pattern and the hard mask 235 as etch masks, the third interlayer insulation layer 230 and the second interlayer insulation layer 206 may be etched to form storage node contact holes 240 exposing the landing contact plugs 204. The process for forming the storage node contact holes 240 may be performed using a self-aligned contact (SAC) technique. The photoresist pattern may be removed during the etching process for forming the storage node contact holes 240.

Figure 5:
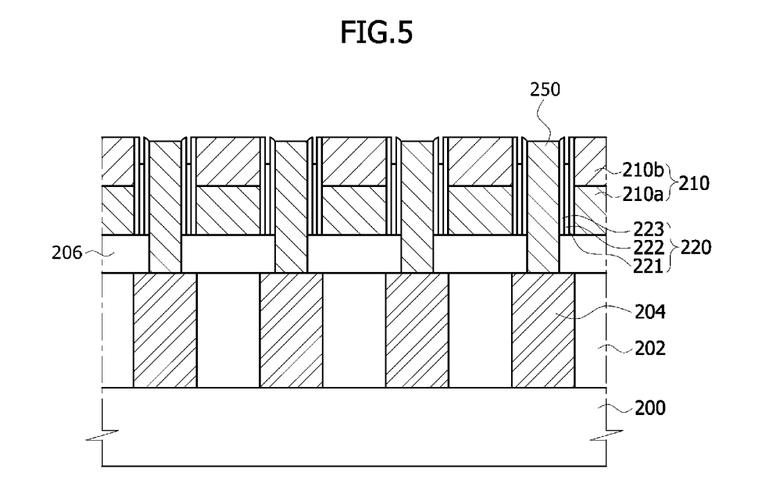

Referring to FIG. 5, a cleaning process may be applied to the substrate including the storage node contact holes 240, and a conductive layer such as a polysilicon layer may be formed on the hard mask 235 to fill the storage node contact holes 240. The conductive layer may be etched back or planarized to form storage node contact plugs 250 in respective ones of the storage node contact holes 240. The hard mask 235 may be removed during formation of the storage node contact plugs 250.

Subsequently, the oxide spacers 222 constituting the bit line spacers 220 may be partially etched to form recessed regions having a predetermined depth. The oxide spacers 222 may be etched such that the depth of the recessed regions is less than the thickness of the hard mask patterns constituting the bit line 210. That is, a height of the recessed oxide spacers 222 may be greater than a total height of the barrier metal patterns and the metal patterns constituting the bit line 210.

The oxide spacers 222 may be partially etched using an oxide etchant to form the recessed regions. For example, the oxide spacers 222 may be partially etched using a buffered oxide etchant (BOE), which is formed by mixing ammonium fluoride ($NH_4F$) solution and hydrofluoric (HF) acid in a volume ratio of 50:1 to 300:1, for 100 seconds to 500 seconds. Alternatively, the oxide spacers 222 may be partially etched using a buffered oxide etchant (BOE), which is formed by mixing ammonium fluoride ($NH_4F$) solution and hydrofluoric (HF) acid in a volume ratio of 50:1 to 100:1, for 100 seconds to 300 seconds.

Figure 6:
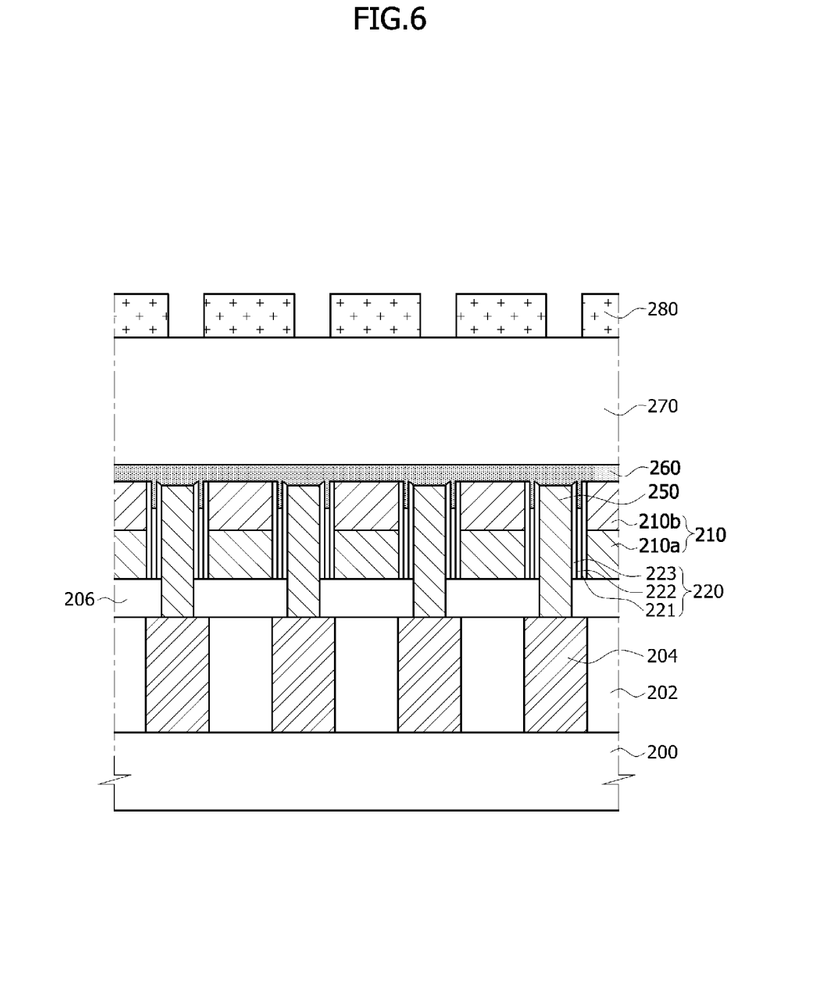

Referring to FIG. 6, a nitride layer 260 may be formed on the bit line stacks 210 and the bit line spacers 220. The nitride layer 260 may be formed to a sufficient thickness to fill the recessed regions formed by partially etching the oxide spacers 220. The nitride layer 260 may be formed using a low pressure chemical vapor deposition (LPCVD) process.

The nitride layer 260 may prevent the bit line spacers 220 from being etched in a subsequent cleaning process and/or a subsequent oxide etching process and may act as an etch stop layer during a subsequent patterning process for forming storage node electrode holes. As described above, only upper portions of the initial oxide spacers 222, which are adjacent to the hard mask patterns constituting the bit line 210, may be replaced with portions of the nitride layer 260. Thus, the nitride layer 260 filling the regions on the recessed oxide spacers 222 may not affect coupling capacitance (e.g., a parasitic capacitance) between the bit line 210 and the storage node contact plugs 250.

A sacrificial oxide layer 270 may be formed on a top surface of the nitride layer 260 opposite to the bit line 210 and the storage node contact plugs 250. A photoresist pattern 280 may be formed on the sacrificial oxide layer 270 to define regions where storage node electrodes are formed. As illustrated in FIG. 6, the photoresist pattern 280 may be misaligned with the storage node contact plugs 250 during a photolithography process for forming the photoresist pattern 280.

Figure 7:
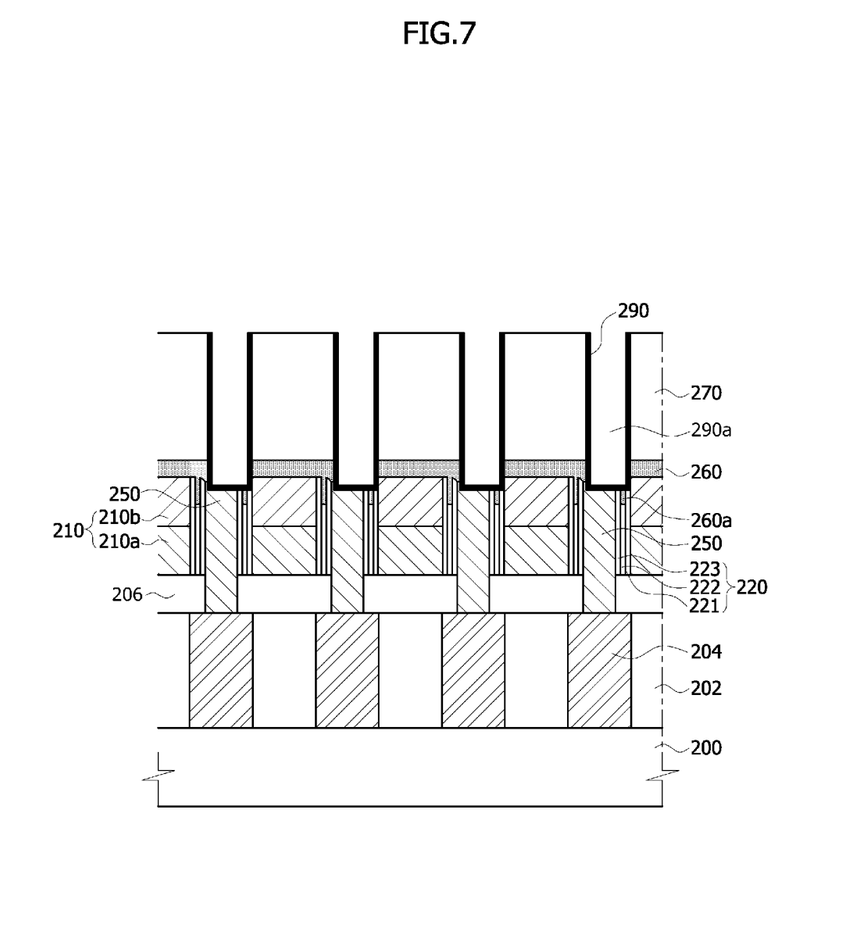

Referring to FIG. 7, the sacrificial oxide layer 270 and the nitride layer 260 may be etched using the photoresist pattern (280 of FIG. 6) as an etch mask to form storage node electrode holes 290a and expose respective ones of the storage node contact plugs 250. In the event that the photoresist pattern 280 is misaligned with the storage node contact plugs 250, portions of the bit line spacers 220 may be exposed by the storage node electrode holes 290a or may be etched during formation of the storage node electrode holes 290a. However, nitride patterns 260a on the recessed oxide spacers 222 may act as etch stop layers during an etching process for forming the storage node electrode holes 290a. That is, even though the photoresist pattern 280 is misaligned with the storage node contact plugs 250, the nitride patterns 260a may prevent the recessed oxide spacers 222 from being additionally etched during formation of the storage node electrode holes 290a.

A conductive layer such as a titanium (Ti) layer, a titanium nitride (TiN) layer or a combination layer thereof may then be formed on the sacrificial oxide layer 270 and in the storage node electrode holes 290a. The conductive layer may be etched or planarized to form storage node electrodes 290 in respective ones of the storage node electrode holes 290a. Subsequently, the sacrificial oxide layer 270 may be removed to increase surface areas of the storage node electrodes 290.

According to the embodiments set forth above, bit line spacers having an NON structure may be formed on sidewalls of bit line stacks, and storage node contact plugs may be formed between the bit line stacks. Each of the bit lines spacers may be formed to include first and second nitride spacers and an oxide spacer between the first and second nitride spacers. Upper portions of the oxide spacers constituting the bit line spacers between two nitride spacers may be selectively etched to form recessed regions, and the recessed regions may be filled with nitride patterns having an etch selectivity with respect to the initial oxide spacers. Thus, even though storage node electrode holes exposing storage node contact plugs are misaligned with the storage node contact plugs, the nitride patterns filling the recessed regions may prevent the recessed oxide spacers from being further etched during formation of the storage node electrode holes. Accordingly, electrical shortage between the storage node contact plugs and the conductive patterns of the bit line stacks may be suppressed because of the presence of the nitride patterns filling the recessed regions. Further, the nitride patterns may be disposed only on sidewalls of upper portions (e.g., insulating hard mask patterns) constituting the bit line stacks. Thus, the nitride patterns may not affect a coupling capacitance (e.g., a parasitic capacitance) between lower portions (e.g., conductive patterns) of the bit line stacks and the storage node contact plugs.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of manufacturing a semiconductor device, the method comprising:
   forming bit lines on a semiconductor substrate;
   forming triple-layered bit line spacers on respective ones of sidewalls of the bit lines;
   forming an interlayer insulation layer on the bit lines and the triple-layered bit line spacers;
   forming storage node contact plugs that penetrate the interlayer insulation layer between the bit lines;
   etching portions of the triple-layered bit line spacers to form recessed regions;
   forming an insulation layer on the substrate including the recessed regions; and
   forming storage node electrodes electrically connected to the storage node contact plugs.

2. The method of claim 1, wherein each of the bit lines is formed to include a conductive pattern and a hard mask pattern which are sequentially stacked.

3. The method of claim 1:
wherein each of the triple-layered bit line spacers is formed to include a first spacer adjacent to one of the bit lines, a third spacer adjacent to the storage node contact plugs and a second spacer between the first and third spacers; and
wherein the second spacer is formed to include a lower portion and an upper portion having a different material from the lower portion.

4. The method of claim 3, wherein the first and third spacers are formed of a nitride layer, and the lower portions of the second spacers are formed of a material having a lower dielectric constant than the first and third spacers.

5. The method of claim 4, wherein the lower portions of the second spacers are formed of an oxide layer.

6. The method of claim 1, wherein the second spacers are oxide layers which are formed using a radical oxidation process, a wet oxidation process or a dry oxidation process.

7. The method of claim 1, wherein forming the storage node contact plugs includes:
etching the interlayer insulation layer to form storage node contact holes exposing the semiconductor substrate between the bit lines;
forming a conductive layer on the interlayer insulation layer and in the storage node contact holes; and
etching back or planarizing the conductive layer.

8. The method of claim 7, wherein etching back or planarizing the conductive layer is performed using a chemical mechanical polishing (CMP) process.

9. The method of claim 1, wherein etching portions of the triple-layered bit line spacers is performed by a wet etching process that uses an oxide etchant.

10. The method of claim 9, wherein etching portions of the triple-layered bit line spacers is performed using a buffered oxide etchant (BOE), which is formed by mixing ammonium fluoride ($NH_4F$) solution and hydrofluoric (HF) acid in a volume ratio of 50:1 to 300:1, for 100 seconds to 500 seconds.

11. The method of claim 9, wherein etching portions of the triple-layered bit line spacers is performed using a buffered oxide etchant (BOE), which is formed by mixing ammonium fluoride ($NH_4F$) solution and hydrofluoric (HF) acid in a volume ratio of 50:1 to 100:1, for 100 seconds to 300 seconds.

12. The method of claim 1:
wherein each of the bit lines is formed to include a conductive pattern and a hard mask pattern which are sequentially stacked; and
wherein etching portions of the triple-layered bit line spacers is performed such that a height of the etched spacers is greater than a height of the conductive patterns constituting the bit lines.

13. The method of claim 1, wherein the insulation layer is formed of a nitride layer and the recessed regions are filled with the insulation layer.

14. The method of claim 1, wherein the insulation layer is used as an etch stop layer.

15. The method of claim 1, wherein forming the storage node electrodes includes:
forming a sacrificial layer on the insulation layer;
patterning the sacrificial layer and the insulation layer to form a storage node electrode holes exposing the storage node contact plugs;
forming a conductive layer on the substrate including the storage node electrode holes; and
etching or planarizing the conductive layer to leave a portion of the conductive layer in the storage node electrode holes.

* * * * *